(12) United States Patent
Tamura et al.

(10) Patent No.: US 11,075,143 B2
(45) Date of Patent: Jul. 27, 2021

(54) COOLING APPARATUS

(71) Applicant: SHOWA DENKO K.K., Tokyo (JP)

(72) Inventors: Shinobu Tamura, Oyama (JP);
Takayuki Matsuzawa, Oyama (JP)

(73) Assignee: SHOWA DENKO K.K., Tokyo (JP)

( * ) Notice: Subject to any disclaimer, the term of this patent is extended or adjusted under 35 U.S.C. 154(b) by 123 days.

(21) Appl. No.: 16/309,455

(22) PCT Filed: Jul. 11, 2017

(86) PCT No.: PCT/JP2017/025203
§ 371 (c)(1),
(2) Date: Dec. 13, 2018

(87) PCT Pub. No.: WO2018/021009
PCT Pub. Date: Feb. 1, 2018

(65) Prior Publication Data
US 2019/0139863 A1    May 9, 2019

(30) Foreign Application Priority Data

Jul. 26, 2016 (JP) .............................. JP2016-146060

(51) Int. Cl.
*H01L 23/473* (2006.01)
*H05K 7/20* (2006.01)
*F28F 3/02* (2006.01)

(52) U.S. Cl.
CPC ............ *H01L 23/473* (2013.01); *F28F 3/022* (2013.01); *H05K 7/20* (2013.01); *H05K 7/20872* (2013.01); *H05K 7/20927* (2013.01)

(58) Field of Classification Search
CPC ......... H01L 23/36; H01L 23/473; H05K 7/20; H05K 7/20872; H05K 7/20972; F28F 3/022
See application file for complete search history.

(56) References Cited

U.S. PATENT DOCUMENTS

2015/0085446 A1* 3/2015 Hable ................... H05K 1/021
                                                         361/719
2018/0266773 A1* 9/2018 Hislop ................... F28F 3/022

FOREIGN PATENT DOCUMENTS

JP    2000-101008    4/2000
JP    2008-166423    7/2008
(Continued)

OTHER PUBLICATIONS

JP-2013239676-A translation.*
International Search Report for corresponding International Application No. PCT/JP2017/025203, dated Sep. 26, 2017.
(Continued)

*Primary Examiner* — Elizabeth J Martin
(74) *Attorney, Agent, or Firm* — Mori & Ward, LLP

(57) ABSTRACT

A cooling apparatus includes a casing including a top wall, a bottom wall, and a cooling fluid passage. A heat radiator arranged in the cooling fluid passage includes heat radiation units arranged in a vertical direction and at least one intermediate plate each of which is arranged between adjacent heat radiation units of the heat radiation units in the vertical direction. Each of the heat radiation units includes a substrate and pin fins provided on the substrate. The substrate of each of the heat radiation units and the at least one intermediate plate are spaced apart in the vertical direction. The pin fins of the adjacent heat radiation units are in thermal contact with the at least one intermediate plate. The pin fins of the uppermost and lowermost heat radiation units of the heat radiation units are in thermal contact with the top and bottom walls of the casing, respectively.

12 Claims, 5 Drawing Sheets

(56) References Cited

FOREIGN PATENT DOCUMENTS

| JP | 2010-010418 | 1/2010 |
| JP | 2010-165714 | 7/2010 |
| JP | 2013-239675 | 11/2013 |
| JP | 2013-239676 | 11/2013 |
| JP | 2013239676 A * | 11/2013 |
| WO | WO 2011/004815 | 1/2011 |

OTHER PUBLICATIONS

Written Opinion for corresponding International Application No. PCT/JP2017/025203, dated Sep. 26, 2017.

* cited by examiner

COOLING APPARATUS

FIELD OF THE INVENTION

The present invention relates to a cooling apparatus for cooling a heating element composed of an electronic component such as, e.g., a semiconductor element.

Note that in this specification and claims, upper and lower sides of FIG. 2 will be referred to as "upper" and "lower" sides.

BACKGROUND ART

For example, as a cooling apparatus for cooling a power device (semiconductor element), such as, e.g., an IGBT (Insulated Gate Bipolar Transistor), for use in a power conversion device to be mounted on an electric vehicle, a hybrid vehicle, a train, etc., the present applicant previously proposed a cooling apparatus (see Patent Document 1). The cooling device is provided with a casing having a top wall and a bottom wall and provided with a cooling fluid passage therein and a heat radiator arranged in the cooling fluid passage in the casing. The heat radiator is configured by a single heat radiation unit composed of one horizontal substrate and a plurality of vertical pin-like fins provided on the upper and lower surfaces of the substrate with its longitudinal direction oriented vertically. The substrate of the heat radiation unit and the top wall and the bottom wall of the casing are vertically spaced apart. The tip end of the upper side pin-like fin of the heat radiation unit is secured to the top wall of the casing. Similarly, the tip end of the lower side pin-like fin is secured to the bottom wall of the casing.

However, with the increase in output power of a semiconductor element in recent years, the heat value of the semiconductor element has been increased, which requires further improvement of the performance of the cooling apparatus.

PRIOR ART DOCUMENT

Patent Document

Patent Document 1: Japanese Unexamined Patent Application Publication No. 2013-239675

SUMMARY OF THE INVENTION

Problems to be Solved by the Invention

An object of the present invention is to provide a cooling apparatus capable of further improving a cooling performance in response to the above-described request.

Means for Solving the Problems

The present invention has the following aspects in order to achieve the above-described object.

(1) A cooling apparatus comprising:
a casing provided with a top wall, a bottom wall, and a cooling fluid passage therein; and
a heat radiator arranged in the cooling fluid passage in the casing,
wherein the heat radiator is provided with a plurality of heat radiation units arranged in a stacked manner in a vertical direction and an intermediate plate arranged between adjacent heat radiation units,
wherein the heat radiation unit is composed of a substrate and a plurality of pin-like fins provided on the substrate in a state in which its longitudinal direction is oriented in the vertical direction,
wherein the substrate of the heat radiation unit and the intermediate plate are spaced apart in the vertical direction,
wherein the pin-like fin of the uppermost heat radiation unit is in thermal contact with the top wall of the casing,
wherein the pin-like fin of the lowermost heat radiation unit is in thermal contact with the bottom wall of the casing, and
wherein the pin-like fins of the heat radiation units located on the upper and lower sides of the intermediate plate are in thermal contact with the intermediate plate between the heat radiation units adjacent in the vertical direction.

(2) The cooling apparatus as recited in the aforementioned Item (1),
wherein the pin-like fin of the heat radiation unit is provided on both surfaces of the substrate, and
wherein the intermediate plate is placed between the pin-like fins of the heat radiation units arranged adjacently in the vertical direction.

(3) The cooling apparatus as recited in the aforementioned Item (2),
wherein a tip end of the upper side pin-like fin of the uppermost heat radiation unit is metallurgically secured to the top wall of the casing and a tip end of the lower side pin-like fin is metallurgically secured to the intermediate plate, and
wherein a tip end of the lower side pin-like fin of the lowermost heat radiation unit is metallurgically secured to the bottom wall of the casing and a tip end of the upper side pin-like fin is metallurgically secured to the intermediate plate.

(4) The cooling apparatus as recited in the aforementioned Item (3),
wherein the plurality of heat radiation units consists of three or more heat radiation units arranged in a stacked manner in the vertical direction via an intermediate plate, and
wherein tip ends of the upper and lower pin-like fins of the heat radiation unit excluding uppermost and lowermost heat radiation units are metallurgically secured to the intermediate plate.

(5) The cooling apparatus as recited in the aforementioned Item (2),
wherein the pin-like fin is circular in cross-sectional shape,
wherein the pin-like fin is 4 mm or less in diameter,
wherein a distance between the intermediate plate and the substrates of the heat radiation units arranged on upper and lower sides of the intermediate plate is 1.3 mm or less, and
wherein when a diameter of the pin-like fin is D mm and a pitch of two closest pin-like fins of the radiation fin is P mm, P is equal to or smaller than D+2 mm (P≤D+2 mm).

(6) The cooling apparatus as recited in the aforementioned Item (2),
wherein a through-hole is formed in the substrate,
wherein a rod-shaped fin forming member is inserted into the through-hole so that a certain length portion of the fin forming member on both end sides thereof in a longitudinal direction protrudes from the through-hole,
wherein the fin forming member is secured to the substrate at a portion of the fin forming member arranged in the through-hole, and
wherein a portion of the fin forming member protruding from the through-hole is served as the pin-like fin.

(7) The cooling apparatus as recited in the aforementioned Item (1), wherein the plurality of heat radiation units consists of two heat radiation units arranged in a stacked manner in the vertical direction via an intermediate plate, wherein the pin-like fin of the upper side heat radiation unit is provided only on a lower surface of the substrate, wherein the pin-like fin of the lower heat radiation unit is provided only on an upper surface of the substrate, wherein the substrate of the upper side heat radiation unit is metallurgically secured to the top wall of the casing and a tip end of the pin-like fin of the upper side heat radiation unit is secured to the intermediate plate, wherein the substrate of the lower side heat radiation unit is secured to the bottom wall of the casing and a tip end of the pin-like fin of the lower side heat radiation unit is metallurgically secured to the intermediate plate.

(8) The cooling apparatus as recited in the aforementioned Item (7), wherein a through-hole is formed in the substrate, wherein one longitudinal end portion of a rod-shaped fin forming member is inserted into the through-hole and a remainder of the rod-shaped fin member is protruded from the through-hole, wherein the fin forming member is secured to the substrate at a portion of the fin forming member existing in the through-hole, wherein a portion of the fin forming member protruding from the through-hole is served as the pin-like fin, wherein an upper end surface of the fin forming member of the upper side heat radiation unit is flush with an upper surface of the substrate and is metallurgically secured to the top wall of the casing, wherein a lower end surface of the fin forming member of the lower side heat radiation unit is flush with a lower surface of the substrate and is metallurgically secured to the bottom wall of the casing.

(9) The cooling apparatus as recited in the aforementioned Item (6) or (8), wherein the substrates of all of the heat radiation units and all of the intermediate plates are alternately integrated with each other through connecting members at both ends in a direction perpendicular to a flow direction of the cooling fluid in the cooling fluid passage of the casing.

(10) The cooling apparatus as recited in the aforementioned Item (1), wherein the pin-like fins of the heat radiation units adjacent in the vertical direction are the same in cross-sectional shape and size, and wherein the pin-like fins of the heat radiation units adjacent in the vertical direction overlap at least partially when viewed from a plane.

(11) The cooling apparatus as recited in the aforementioned Item (1), wherein the pin-like fin is circular in cross-sectional shape, and wherein when a thickness of the substrate is T mm and a diameter of the pin-like fin is D mm, T is equal to or larger than D/8 (T≥D/8).

Effects of the Invention

According to the cooling apparatus recited in the aforementioned Items (1) to (11), the heat radiator arranged in the cooling fluid passage in the casing is provided with a plurality of heat radiation units arranged in a stacked manner in the vertical direction and an intermediate plate arranged between adjacent heat radiation units. The heat radiation unit includes a substrate and a plurality of pin-like fins provided on the substrate with its longitudinal direction oriented vertically. The substrate of the heat radiation unit and the intermediate plate are separated in the vertical direction. The pin-like fin of the uppermost heat radiation unit is in thermal contact with the top wall of the casing. The pin-like fin of the lowermost heat radiation unit is in thermal contact with the bottom wall of the casing. The pin-like fins of the heat radiation units located on the upper and lower sides of the intermediate plate are in thermal contact with the intermediate plate between the heat radiation units adjacent in the vertical direction. Therefore, the heat emitted from the heating element attached to at least one of the top wall and the bottom wall is transmitted to the pin-like fins of the heat radiation unit arranged at the end portion on the wall side to which the heating element is attached, and then transmitted from the pin-like fin to the cooling fluid flowing through the cooling fluid passage of the casing. Further, the heat transferred to the pin-like fins of the heat radiation unit arranged at the end portion on the wall side to which the heating element is attached is transmitted to the substrate of the heat radiation unit and then transmitted from the substrate to the cooling fluid flowing through the cooling fluid passage of the casing. Further, the heat transferred to the pin-like fins of the heat radiation unit arranged at the end portion on the wall side to which the heating element is attached is transmitted to the intermediate plate with which the pin-like fins are in thermal contact, and then transmitted from the intermediate plate to the cooling fluid flowing through the cooling fluid passage of the casing, while transmitted from the intermediate plate to the adjacent pin-like fins of the heat radiation unit, and then transmitted from the pin-like fins to the cooling fluid flowing through the cooling fluid passage of the casing. By repeating the above-described heat transfer, the heat emitted from the heating element is transmitted to the pin-like fins and the substrates of all of the heat radiation units and transmitted from all of the intermediate plates to the cooling fluid flowing through the cooling fluid passage. As a result, the heating element is cooled. Therefore, as compared with the cooling apparatus disclosed in Patent Document 1, since the heat transfer area to the cooling fluid flowing through the cooling fluid passage of the casing is larger, the cooling performance can be improved.

According to the cooling apparatus recited in the aforementioned Item (2), it becomes possible to arbitrarily change the number of heat radiation units constituting the heat radiator. Moreover, since both surfaces of the substrate of each of all the heat radiation units contribute to the heat transfer to the cooling fluid, it becomes possible to effectively improve the cooling performance.

According to the cooling apparatus recited in the aforementioned Item (3), the thermal conductivity between the wall to which the heating element is attached and the pin-like fin secured to the wall and the thermal conductivity between the pin-like fin and the intermediate plate to which the pin-like fin is secured can be improved.

According to the cooling apparatus recited in the aforementioned Items (4), the thermal conductivity between the pin-like fins of adjacent heat radiation units via the intermediate plate can be improved.

According to the cooling apparatus recited in the aforementioned Item (5), it is possible to effectively increase the heat transfer area from the heat radiator to the cooling fluid while suppressing the remarkable increase in the passage resistance at the cooling fluid passage.

According to the cooling apparatuses recited in the aforementioned Items (6) and (8), it is possible to produce the heat radiation unit relatively easily and inexpensively.

According to the cooling apparatuses recited in the aforementioned Items (7) and (8), the thermal conductivity between the wall to which the heating element is attached and the pin-like fin metallurgically secured to the wall and the thermal conductivity between the pin-like fin and the intermediate plate to which the pin-like fin is metallurgically secured can be improved.

According to the cooling apparatus as recited in the aforementioned Item (9), the substrates, the intermediate plates, and the connecting members of all of the heat radiation units can be formed by, for example, bending a single plate. As a result, it becomes possible to reduce the number of parts and improve the positioning accuracy of the upper and lower heat radiation units.

According to the cooling apparatus recited in the aforementioned Item (10), the heat conduction path between the pin-like fins of the adjacent heat radiation units via the intermediate plate becomes wider, which improves the thermal conductivity between the pin-like fins of both the heat radiation units.

According to the cooling apparatus recited in the aforementioned Item (11), in each heat radiation unit, the thermal conductivity between the pin-like fin and the substrate can be improved.

DESCRIPTION OF REFERENCE SYMBOLS

Figure 1:
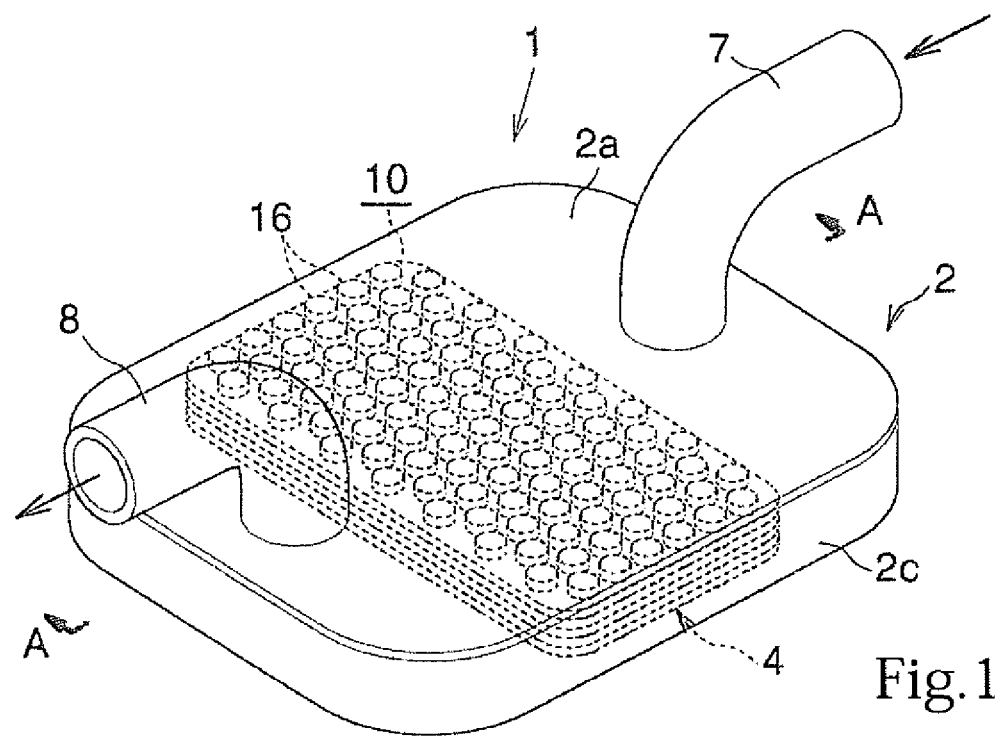
FIG. 1 is a perspective view showing the overall configuration of the cooling apparatus according to the present invention.

1: cooling apparatus
2: casing
2a: top wall
2b: bottom wall
3: cooling fluid passage
4, 20, 25, 30: heat radiator
10, 26: heat radiation unit
11: intermediate plate
12: substrate
13, 14, 27: pin-like fin
15: through-hole
16: fin forming member

EMBODIMENT FOR CARRYING OUT THE INVENTION

Hereinafter, some embodiments of the present invention will be described with reference to the drawings. In this embodiment, the cooling apparatus according to the present invention is applied to a liquid cooling type cooling apparatus.

Note that in this specification, the term "aluminum" includes the meaning of aluminum alloy in addition to pure aluminum.

Figure 2:
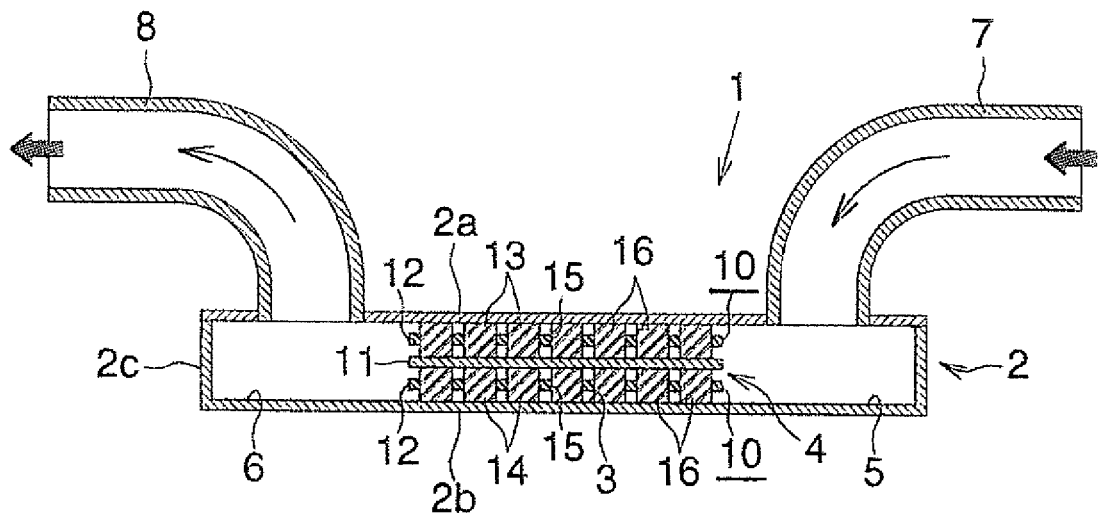
FIG. 2 is a cross-sectional view taken along the line A-A of FIG. 1.

Further note that in the following description, the left and right sides in FIG. 2 are referred to as the "left" and "right" sides.

Further note that the same symbols are allotted to the same items and the same portions throughout the drawings.

Figure 3:
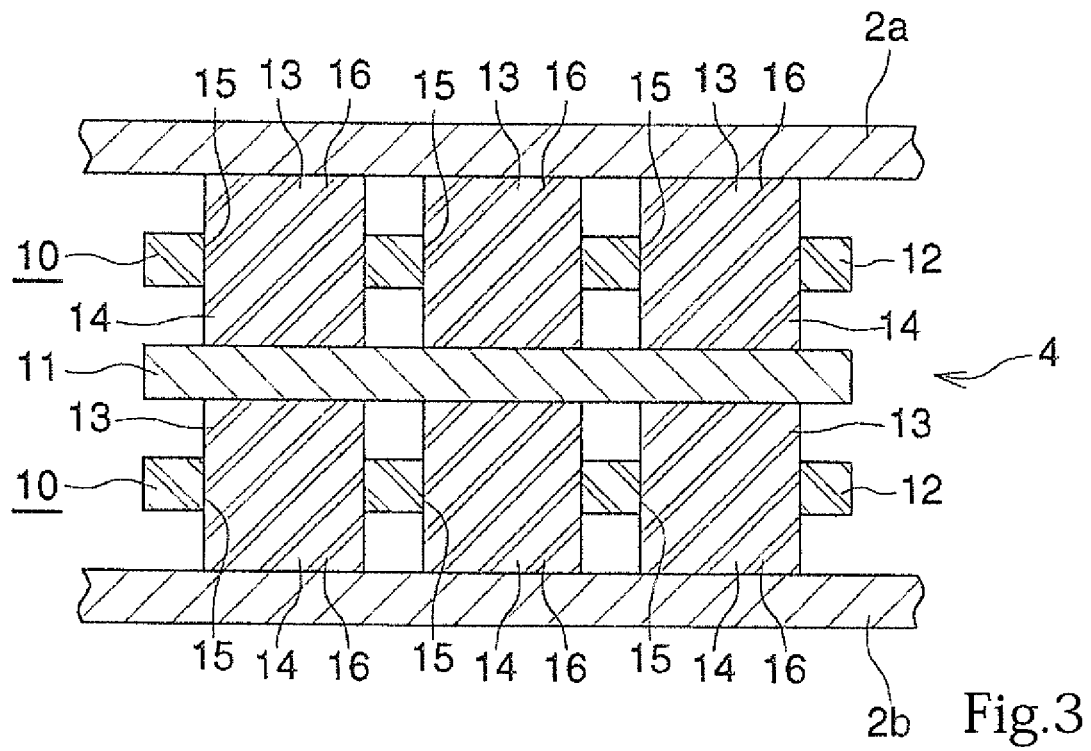
FIG. 3 is a partially enlarged view of FIG. 2.
Figure 4:
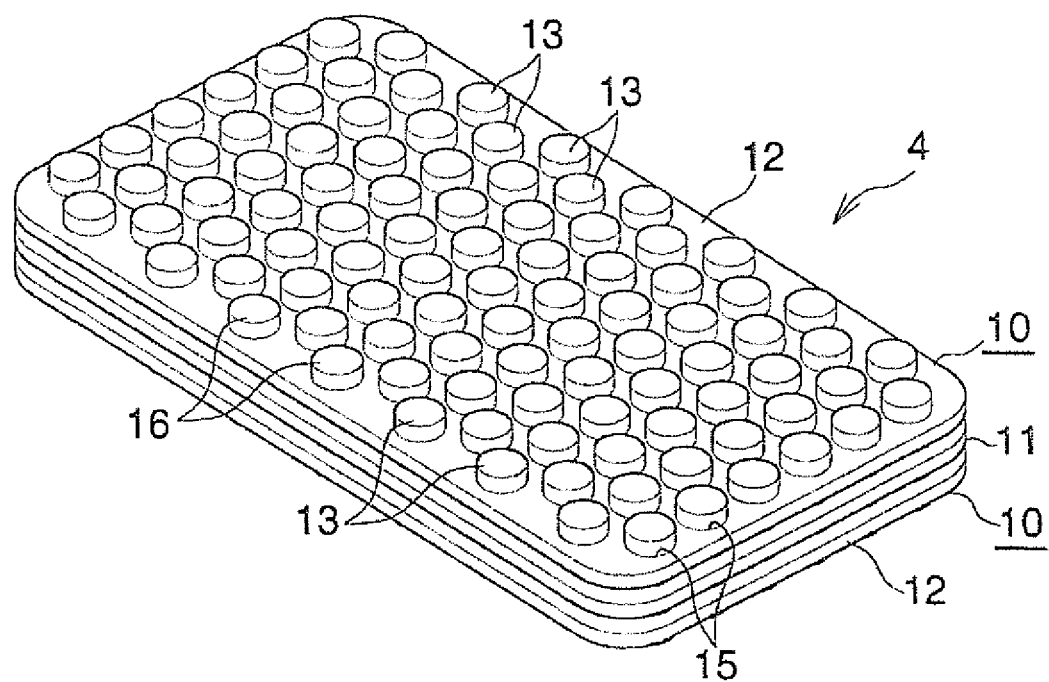
FIG. 4 is a perspective view showing the overall configuration of the heat radiator for use in the cooling apparatus of FIG. 1.

FIG. 1 and FIG. 2 show the overall structure of the cooling apparatus according to the present invention, and FIG. 3 shows the configuration of the main part. FIG. 4 shows the heat radiator used in the cooling apparatus of FIG. 1.

In FIG. 1 and FIG. 2, the cooling apparatus 1 is provided with: a hollow casing 2 having a top wall 2a, a bottom wall 2b, and a peripheral wall 2c and provided with a cooling fluid passage 3 therein; and a heat radiator 4 arranged in the cooling fluid passage 3 in the casing 2.

At one end in the casing 2, here in this embodiment, at the portion closer to the right end, an inlet header 5 into which the cooling fluid flows from outside is provided. At the other end side of the casing 2 in the longitudinal direction, here in this embodiment, at the portion closer to the left end, an outlet header 6 through which the cooling fluid flows out to the outside is provided. The cooling fluid passage 3 is configured to flow the cooling fluid flowing into the inlet header 5 to the outlet header 6. In the top wall 2a of the casing 2, an aluminum inlet pipe 7 for supplying a cooling fluid to the inlet header 5 in the casing 2 and an aluminum outlet pipe 8 for discharging the cooling fluid from the outlet header 6 in the casing 2 are connected. Further, it is configured such that on the outer surface of at least one of the outer surface of the top wall 2a and the outer surface of the bottom wall 2b of the casing 2, here in this embodiment, the outer surface of the top wall 2a, a heating element (not shown), such as, e.g., a power device such as an IGBT, an IGBT module in which an IGBT is integrated with a control circuit and housed in the same package, an intelligent power module in which a protection circuit is further integrated with the IGBT module and housed in the same package, is attached.

As shown in FIG. 2 to FIG. 4, the heat radiator 4 is provided with a plurality of heat radiation units 10, in this embodiment two heat radiation units 10, arranged in a stacked manner in the vertical direction and an aluminum intermediate plate 11 arranged between adjacent heat radiation units 10. The heat radiation unit 10 is composed of a horizontal aluminum substrate 12 and a plurality of aluminum pin-like fins (pin fins) 13, 14 provided so as to protrude from the substrate 12 on both surfaces of the substrate 12 with its longitudinal direction oriented in the vertical direction. A plurality of circular through-holes 15 is formed in the substrate 12, and an aluminum round rod-shaped fin forming member 16 is inserted in the circular through-hole 15 and secured to the substrate 12 with the longitudinal central portion positioned in the circular through-hole 15. The portions of the fin forming member 16 protruding upward and downward from the circular through-hole 15 of the fin forming member 16 are served as upper and lower pin-like fins (upper pin fins and lower pin fins) 13, 14. Securing of the fin forming member 16 to the substrate 12 is performed by being press-fitted into the circular through-hole 15 or secured by a brazing material (hereinafter referred to as "brazing").

The tip end of the upper side pin-like fin 13 of the upper (uppermost) heat radiation unit 10 is brazed to the inner surface of the top wall 2a of the casing 2 to be in thermal contact therewith. In the same manner, the tip end of the lower side pin-like fin 14 is brazed to the upper surface of the intermediate plate 11 to be in thermal contact therewith. Further, the tip end of the lower side pin-like fin 14 of the lower (lowermost) heat radiation unit 10 is brazed to the inner surface of the bottom wall 2b of the casing 2 to be in thermal contact therewith. In the same manner, the tip end of the upper side pin-like fin 13 is brazed to the lower surface of the intermediate plate 11 to be in thermal contact therewith. In this way, the substrates 12 of both the heat radiation units 10 and the intermediate plate 11 are vertically spaced apart. The upper and lower pin-like fins 13, 14 of both the vertically arranged heat radiation units 10 are each circler in cross-sectional shape and equal in size. All of the upper and lower pin-like fins 13, 14 of both the heat radiation units 10 arranged adjacently in the vertical direction are overlapped at least partly, entirely in this embodiment, as viewed from a plane.

Here, when the thickness of the substrate 12 is T mm and the diameter of each of the upper and lower pin-like fins 13, 14 is D mm, it is preferable that T be equal to or larger than D/8 (T≥D/8). In the case of T<D/8, in each heat radiation unit 10, there is a risk of running short in the thermal conductivity between the fin forming member 16 forming the upper and lower pin-like fins 13 and the substrate 12. Further, it is preferable that the diameter D of each of the upper and lower pin-like fins 13, 14 be 4 mm or less and the distance between the intermediate plate 11 and the substrates 12 of the heat radiation units 10 arranged on the upper and lower sides of the intermediate plate 11 be preferably 1.3 mm or less. Further, when the pitch which is the distance between the closest two upper side pin-like fins 13 and the distance between the closest lower side pin-like fins 14 of the heat radiation unit 10 is P mm, it is preferable that P be equal to or small than D+2 mm (P≤D+2 mm).

In the aforementioned cooling apparatus, the cooling fluid that flowed into the inlet header 5 of the casing 2 through the inlet pipe 7 flows into the cooling fluid passage 3, flows between the pin-like fins 13, 14 between the substrates 12 of the upper and lower heat radiation units 10 and the top wall 2a and the bottom wall 2b of the casing 2 and between the substrate 12 of each heat radiation unit 10 and the intermediate plate 11, enters in the outlet header 6, and discharged from the outlet header 6 via the outlet pipe 8. The heat emitted from the heating element attached to the outer surface of the top wall 2a of the casing 2 is transmitted to the top wall 2a, and then transmitted to the substrates 12 of both the heat radiation units 10 and both the upper and lower pin-like fins 13, 14, and then transmitted from the intermediate plate 11 to the cooling fluid flowing thorough the cooling fluid passage 3. Thus, the heating element is cooled.

The heat transfer path of the heat emitted from the heating element and transferred to the top wall 2a of the casing 2 to the cooling fluid flowing through the cooling fluid passage 3 is as follows. The first path that conveys the heat emitted from the heating element attached to the outer surface of the top wall 2a of the casing 2 to the cooling fluid is a path directly from the top wall 2a to the cooling fluid. The second path is a path through which the heat is transmitted from the top wall 2a to both the upper and lower pin-like fins 13, 14 of the upper end heat radiation unit 10 and then transmitted from both the upper and lower pin-like fins 13, 14 to the cooling fluid. The third path is a path through which the heat is transmitted from the top wall 2a to the substrate 12 via the upper side pin-like fin 13 of the upper end heat radiation unit 10 and then transmitted from the substrate 12 to the cooling fluid. The fourth path is a path through which the heat is transmitted from the top wall 2a to the intermediate plate 11 via both the upper and lower pin-like fins 13, 14 of the upper end heat radiation unit 10 and then transmitted to the cooling fluid. The fifth path is a path through which the heat is transmitted from the top wall 2a to both the upper and lower pin-like fins 13, 14 of the lower side heat radiation unit 10 via both the upper and lower pin-like fins 13, 14 of the upper end heat radiation unit 10 and the intermediate plate 11 and then transmitted from both the upper and lower pin-like fins 13, 14 to the cooling fluid. The sixth path is a path through which the heat is transmitted from the top wall 2a to the upper side pin-like fin 13 of the lower side heat radiation unit 10 via both the upper and lower pin-like fins 13, 14 of the upper end heat radiation unit 10 and the intermediate plate 11 and then transmitted to the substrate 12 via the upper side pin-like fin 13, and then transmitted from the substrate 12 to the cooling fluid.

FIG. 5 to FIG. 10 show modified examples of the heat radiator for use in the cooling apparatus of the present invention.

Figure 5:
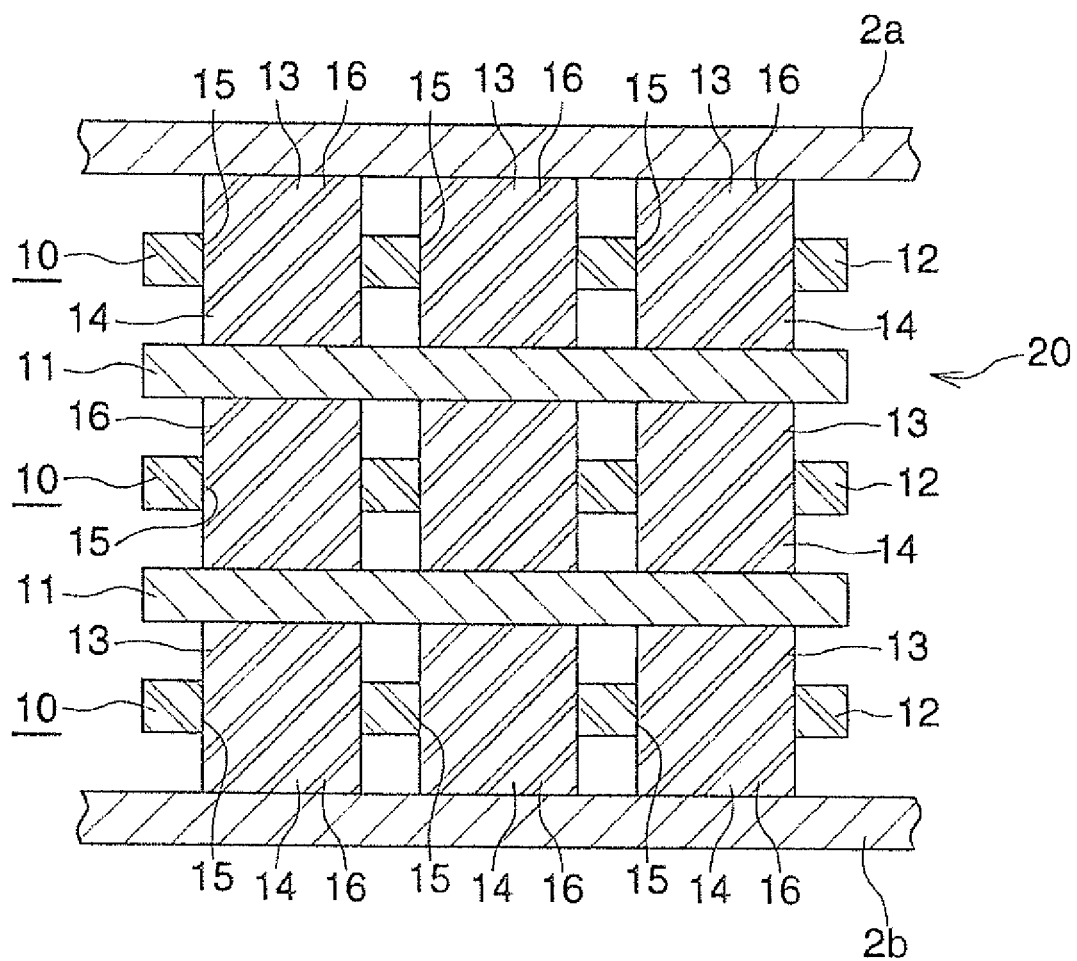
FIG. 5 is a view corresponding to FIG. 3 showing a first modification of the heat radiator for use in the cooling apparatus of FIG. 1.
Figure 6:
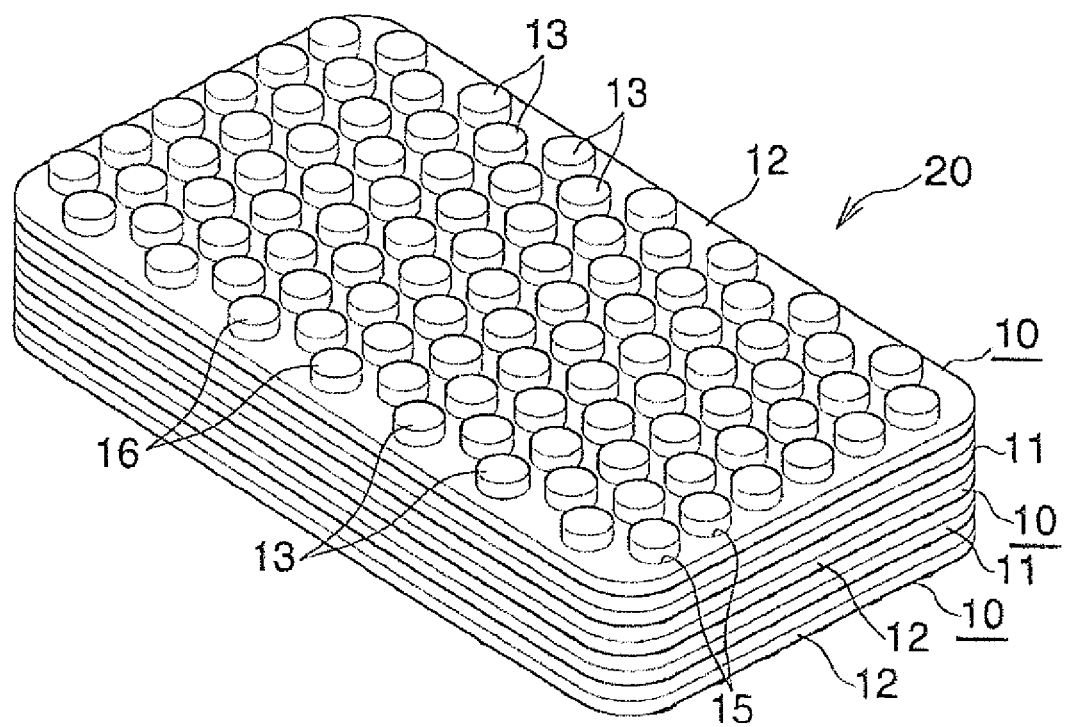
FIG. 6 is a perspective view showing the overall configuration of the first modification of the heat radiator for use in the cooling apparatus of FIG. 1.

The heat radiator 20 shown in FIG. 5 and FIG. 6 is provided with three or more heat radiation units 10, here three heat radiation units 10 in this modification, which are arranged in a stacked manner in the vertical direction and an aluminum intermediate plate 11 arranged between the adjacent heat radiation units 10. The configuration of each heat radiation unit 10 is the same as that of the heat radiation unit 10 used in the cooling apparatus 1 of the aforementioned embodiment.

The tip end of the upper side pin-like fin 13 of the upper end heat radiation unit 10 is brazed to the inner surface of the top wall 2a of the casing 2 to be in thermal contact therewith. In the same manner, the tip end of the lower side pin-like fin 14 is brazed to the upper surface of the upper side intermediate plate 11 to be in thermal contact therewith. The tip end of the lower side pin-like fin 14 of the lower end heat radiation unit 10 is brazed to the inner wall of the bottom wall 2b of the casing 2 to be in thermal contact therewith. In the same manner, the tip end of the upper side pin-like fin 13 is brazed to the lower surface of the intermediate plate 11 to be in thermal contact therewith. Further, the tip end of the upper side pin-like fin 13 of the intermediate heat radiation unit 10 is brazed to the lower surface of the upper side intermediate plate 11 to be in thermal contact therewith. In the same manner, the tip end of the lower side pin-like fin 14 is brazed to the upper surface of the lower side intermediate plate 11 to be in thermal contact therewith. In this way, the substrates 12 of all of the heat radiation units 10 and both the intermediate plates 11 are vertically spaced apart. Both the upper and lower pin-like fins 13, 14 of both the vertically adjacent heat radiation units 10 are each circler in cross-sectional shape and equal in size. All of the pin-like fins 13, 14 of both the heat radiation units 10 adjacent in the vertical direction are overlapped at least partly, here entirely in this embodiment, as viewed from a plane.

The heat emitted from the heating element attached to the outer surface of the top wall 2a of the casing 2 is transmitted to the top wall 2a, and then transmitted from the substrates 12 of both the heat radiation units 10, both the upper and lower pin-like fins 13, 14, and intermediate plates 11 to the cooling fluid flowing through the cooling fluid passage 3. Thus, the heating element is cooled.

Figure 7:
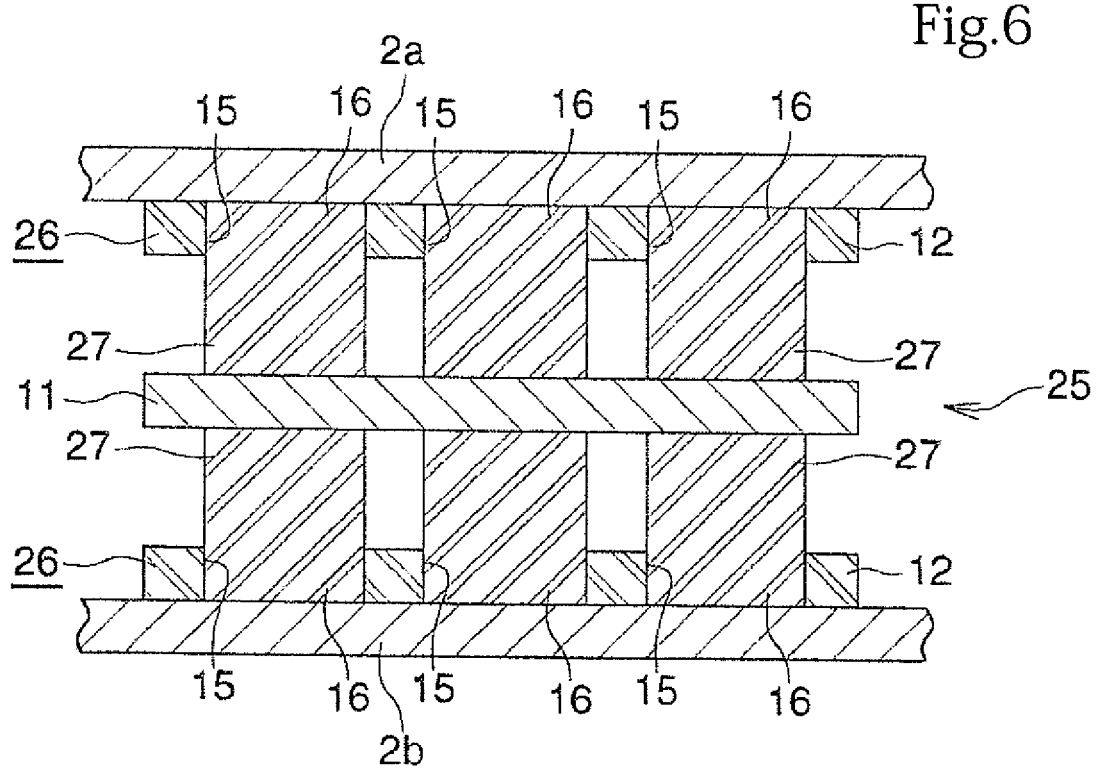
FIG. 7 is a view corresponding to FIG. 3 showing a second modification of the heat radiator for use in the cooling apparatus of FIG. 1.

The heat radiator 25 shown in FIG. 7 is provided with two heat radiation units 26 arranged in a stacked manner in the vertical direction and an aluminum intermediate plate 11 arranged between adjacent heat radiation units 26.

The heat radiation unit 26 is composed of a horizontal aluminum substrate 12 and a plurality of aluminum pin-like fins 27 provided so as to protrude from the substrate 12 on one surface of the substrate 12 with its longitudinal direction oriented in the vertical direction. A plurality of circular through-holes 15 is formed in the substrate 12, and an aluminum round rod-shaped fin forming member 16 is inserted in the circular through-hole 15 and secured to the substrate 12 with the longitudinal one end portion positioned in the circular through-hole 15 and the one end surface flush with one surface of the substrate 12. The portions of the fin forming member 16 protruding from the circular through-hole 15 of the fin forming member 16 are served as the pin-like fin 27. Securing of the fin forming member 16 to the substrate 12 is performed by being press-fitted into the circular through-hole 15 or secured by brazing.

In the upper side heat radiation unit 26, the pin-like fin 27 is provided only on the lower surface of the substrate 12. The substrate 12 of the upper side heat radiation unit 26 is brazed to the top wall 2a of the casing 2. The tip end of the pin-like fin 27 is brazed to the upper surface of the intermediate plate 11 and is in thermal contact therewith. The upper end surface of the fin forming member 16 of the upper side heat radiation unit 26 is inserted in the circular through-hole 15 of the substrate 12 and flush with the upper surface of the substrate 12, and is brazed to the top wall 2a. The pin-like fin 27 of the upper side heat radiation unit 26 is in thermal contact with the top wall 2a of the casing 2. The lower side heat radiation unit 26 is a unit arranged in a state in which the upper side heat radiation unit 26 faces upside down. In the lower side heat radiation unit 26, the pin-like fin 27 is provided only on the upper surface of the substrate 12. The substrate 12 of the lower side heat radiation unit 26 is brazed to the bottom wall 2b of the casing 2. The tip end of the pin-like fin 27 is brazed to the lower surface of the intermediate plate 11 and is in thermal contact therewith. Further, the lower end surface of the fin forming member 16 of the lower side heat radiation unit 26 is inserted in the circular through-hole 15 of the substrate 12 and flush with the lower surface of the substrate 12, and is brazed to the bottom wall 2b. The pin-like fin of the lower side heat radiation unit 26 is in thermal contact with the bottom wall 2b of the casing 2. In this way, the substrates 12 of both the heat radiation units 26 and the intermediate plate 11 are vertically spaced apart. The pin-like fins 27 of both the vertically adjacent heat radiation units 26 are each circler in cross-sectional shape and equal in size. All of the pin-like fins 27 of both the heat radiation units 26 adjacent in the vertical direction are overlapped at least partly, entirely in this embodiment, as viewed from a plane.

Here, when the thickness of the substrate 12 is T mm and the diameter of the pin-like fin 27 is D mm, it is preferable that T be equal to or larger than D/8 (T≥D/8). In the case of T<D/8, in each heat radiation unit 26, there is a risk of running short in the thermal conductivity between the fin forming member 16 forming the pin-like fins 27 and the substrate 12. Further, it is preferable that the diameter D of the pin-like fin 27 be 4 mm or less and the distance between the intermediate plate 11 and the substrates 12 of the heat radiation units 26 arranged on the upper and lower sides of the intermediate plate 11 be preferably 1.3 mm or less. Further, when the pitch which is the distance between the closest two pin-like fins 27 of the heat radiation unit 26 is P mm, it is preferable that P be equal to or small than D+2 mm (P≤D+2 mm).

Figure 8:
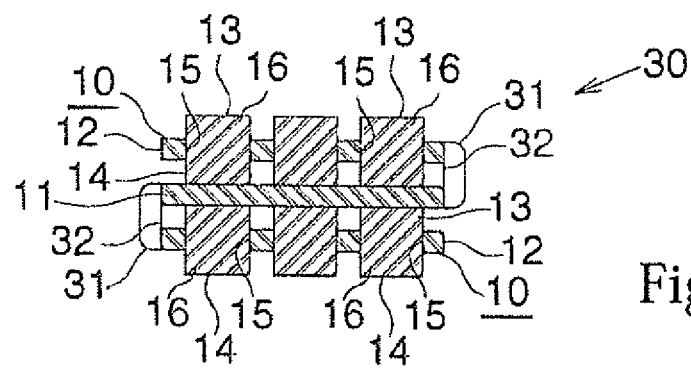
FIG. 8 is a view corresponding to FIG. 3 showing a third modification of the heat radiator for use in the cooling apparatus of FIG. 1.

In the heat radiator 30 shown in FIG. 8, the substrate 12 and the intermediate plate 11 of the upper and lower heat radiation unit 10 of the heat radiator 4 of the above-described embodiment are alternately integrated via a connecting member 31 at both end portions in a direction (the front-to-back direction of the paper in FIG. 2) orthogonal to the flow direction of the cooling fluid in the fluid passage 3. As a result, in the vertical cross-section, the substrate 12 and the intermediate plate 11 are formed into a corrugated shape. In the connecting member 31, a rectangular hole 32 elongated in the front-to-back direction of the page of FIG. 8 is formed in a penetrated manner. The heat radiator 30 is arranged in the cooling fluid passage 3 of the casing 2 with the left-right direction of FIG. 8 faced in the front-back direction of the page of FIG. 2.

Even in the case of the heat radiator 20 shown in FIG. 5 and FIG. 6 and the heat radiator provided with four or more heat radiation units 10, it may be configured such that the substrates 12 of all of the heat radiation units 10 and the intermediate plate 11 of the adjacent heat radiation units 10 are alternately integrated at the left end or the right end via the connecting member, so that the substrates 12 and the intermediate plates 11 are formed in a corrugated shape in the vertical cross-section.

Figure 9:
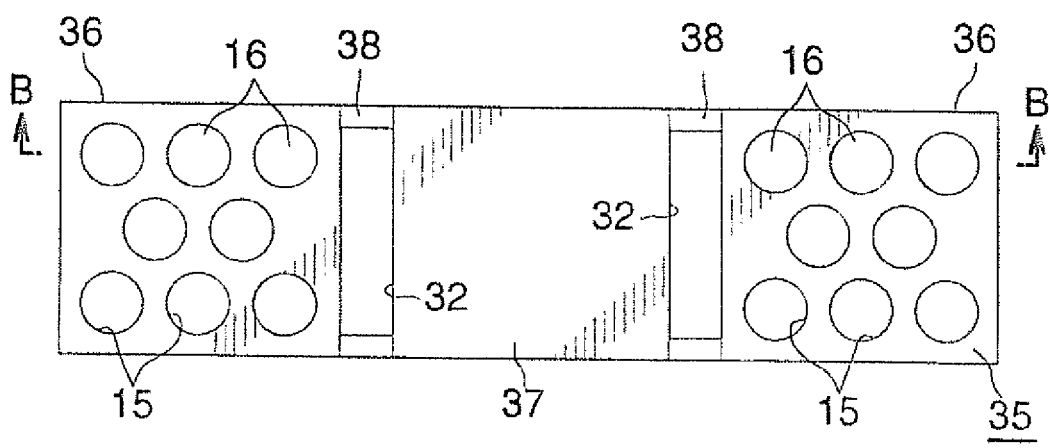
FIG. 9 is a plan view showing a material for producing a third heat radiator in FIG. 8.
Figure 10:
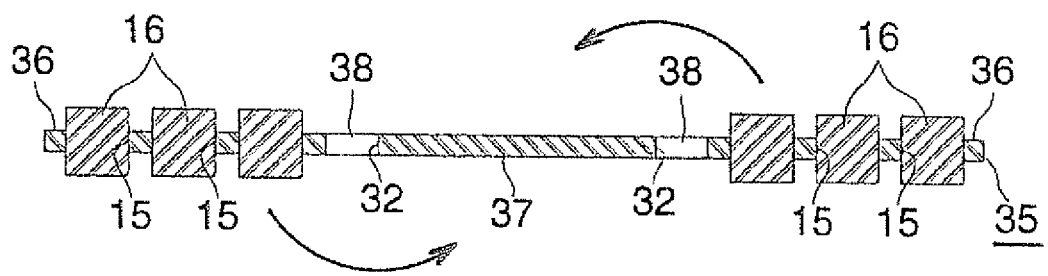
FIG. 10 is a cross-sectional view taken along the line B-B of FIG. 9.

The heat radiator 30 shown in FIG. 8 is produced by the method shown in FIG. 9 and FIG. 10.

That is, a first blank plate 35 is prepared. The first blank plate 35 includes a plurality of substrate forming portions 36 in which a plurality of circular through-holes 15 is formed therein, an intermediate plate forming part 37 positioned between adjacent substrate forming portions 36, and connecting member forming portions 38 each located between the substrate forming portion 36 and the intermediate plate forming part 37 and having a rectangular hole 32. Further, a second blank plate (not shown) of the same material as the fin forming member 16 is prepared. Then, the second blank plate is disposed above so as to be spaced from the first blank 35. A press forming process is applied to the second blank to punch a fin forming member 16. The punched fin forming member 16 is pressed into the circular through-hole 15 of the substrate forming portion 36 of the first blank 35. Thereafter, the first blank plate 35 is bent at both sides of the connecting member forming portion 38 to form a corrugated shape as a whole. Thus, the heat radiator 30 is produced.

The pin-like fins 13, 14, 27 of all of the aforementioned heat radiation units 10 and 26 are produced by securing a rod-shaped fin forming member 16 to the substrate 12 in a state of being inserted in the through-hole 15 formed in the substrate 12, but the present invention is not limited to this. A heat radiation unit composed of substrates and pin-like fins may be produced by forging or cutting a metal blank.

INDUSTRIAL APPLICABILITY

The cooling apparatus according to the present invention is suitably used for cooling a power device, such as, e.g., an IGBT in a power module, such as, e.g., a power conversion device, to be mounted on an electric vehicle, a hybrid vehicle, and a train.

The invention claimed is:

1. A cooling apparatus comprising:
   a casing comprising:
      a top wall;
      a bottom wall opposite to the top wall in a vertical direction; and
      a cooling fluid passage provided between the top wall and the bottom wall in the vertical direction; and
   a heat radiator arranged in the cooling fluid passage in the casing, the heat radiator comprising:
      heat radiation units arranged in a stacked manner in the vertical direction and including an uppermost heat radiation unit provided on the top wall and a lowermost heat radiation unit provided on the bottom wall; and
      at least one intermediate plate each of which is arranged between adjacent heat radiation units of the heat radiation units in the vertical direction,
   wherein each of the heat radiation units comprises a substrate and pin fins provided on the substrate in a state in which its longitudinal direction is oriented in the vertical direction,
   wherein the substrate of each of the heat radiation units and the at least one intermediate plate are spaced apart in the vertical direction such that adjacent pin fins and the substrate of each of the heat radiation units and the at least one intermediate plate define a flow path of a cooling fluid in the cooling fluid passage,
   wherein the pin fins of the uppermost heat radiation unit are in thermal contact with the top wall of the casing,
   wherein the pin fins of the lowermost heat radiation unit are in thermal contact with the bottom wall of the casing,
   wherein the pin fins of the adjacent heat radiation units are in thermal contact with the at least one intermediate plate,
   wherein each of the pin fins has a circular shape in cross-section, and
   wherein when a thickness of the substrate is T mm and a diameter of each of the pin fins is D mm, T is equal to or larger than D/8 (T≥D/8).

2. The cooling apparatus according to claim 1,
   wherein the pin fins provided on an upper surface and a lower surface of the substrate, the lower surface being opposite to the upper surface in the vertical direction, and
   wherein each of the at least one intermediate plate is placed between the pin fins of the adjacent heat radiation units in the vertical direction.

3. The cooling apparatus according to claim 2,
   wherein the pin fins include upper pin fins projecting from the upper surface of the substrate in the vertical direction and lower pin fins projecting from the lower surface of the substrate in the vertical direction,
   wherein tip ends of the upper pin fins of the uppermost heat radiation unit are metallurgically secured to the top wall of the casing and tip ends of the lower pin fins are metallurgically secured to the at least one intermediate plate, and
   wherein tip ends of the lower pin fins of the lowermost heat radiation unit are metallurgically secured to the bottom wall of the casing and tip ends of the upper pin fins are metallurgically secured to the at least one intermediate plate.

4. The cooling apparatus according to claim 3,
   wherein the heat radiation units include at least one intermediate heat radiation unit provided between the uppermost heat radiation unit and the lowermost heat radiation unit in the vertical direction, each of the at least one intermediate plate being sandwiched between adjacent two of the uppermost heat radiation unit, the at least one intermediate heat radiation unit, and the lowermost heat radiation unit, and
   wherein tip ends of the upper pin fins and lower pin fins of the at least one heat radiation unit are metallurgically secured to the at least one intermediate plate.

5. The cooling apparatus according to claim 2,
   wherein each of the pin fins has the circular shape in cross-section,
   wherein the diameter of each of the pin fins is 4 mm or less,
   wherein a distance between the substrate and an adjacent intermediate plate closest to the substrate of the at least one intermediate plate in the vertical direction is 1.3 mm or less, and
   wherein when the diameter of each of the pin fins is D mm and a pitch of two closest pin fins is P mm, P is equal to or smaller than D+2 mm (P≤D+2 mm).

6. The cooling apparatus according to claim 2,
   wherein the substrate has through-holes extending from the upper surface and the lower surface,
   wherein the pin fins are inserted into the through-holes so that portions of the pin fins projecting from the upper surface are upper pin fins and portions of the pin fins projecting from the lower surface are lower pin fins,
   wherein the pin fins are secured to the substrate via the through-holes.

7. The cooling apparatus according to claim 1,
   wherein the heat radiation units consist of the uppermost heat radiation unit and the lowermost heat radiation unit,
   wherein the at least one intermediate plate consists of a single intermediate plate provided between the uppermost heat radiation unit and the lowermost heat radiation unit,
   wherein an upper surface of the substrate of the uppermost heat radiation unit is metallurgically secured to the top wall of the casing,
   wherein the pin fins of the uppermost heat radiation unit project only from a lower surface of the substrate of the uppermost heat radiation unit which is opposite to the upper surface of the uppermost heat radiation unit in the vertical direction,
   wherein lower end surfaces of the pin fins of the uppermost heat radiation unit are secured to the single intermediate plate,
   wherein a lower surface of the substrate of the lowermost heat radiation unit is secured to the bottom wall of the casing,
   wherein the pin fins of the lowermost heat radiation unit project only from an upper surface of the substrate of the lowermost heat radiation unit which is opposite to the lower surface of the lowermost heat radiation unit in the vertical direction, and
   wherein upper end surfaces of the pin fins of the lowermost heat radiation unit are metallurgically secured to the single intermediate plate.

8. The cooling apparatus according to claim 7,
wherein the substrate has through-holes,
wherein the pin fins of the uppermost heat radiation unit are inserted into the through-holes of the uppermost heat radiation unit,
wherein the pin fins of the uppermost heat radiation unit are secured to the substrate at portions of the pin fins of the uppermost heat radiation unit existing in the through-holes of the uppermost heat radiation unit,
wherein the pin fins of the lowermost heat radiation unit are inserted into the through-holes of the lowermost heat radiation unit,
wherein the pin fins of the lowermost heat radiation unit are secured to the substrate at portions of the pin fins of the lowermost heat radiation unit existing in the through-holes of the lowermost heat radiation unit,
wherein upper end surfaces of the pin fins of the uppermost heat radiation unit are flush with the upper surface of the substrate of the uppermost heat radiation unit and are metallurgically secured to the top wall of the casing, and
wherein lower end surfaces of the pin fins of the lowermost heat radiation unit are flush with the lower surface of the substrate of the lowermost heat radiation unit and are metallurgically secured to the bottom wall of the casing.

9. The cooling apparatus as recited in claim 6,
wherein the substrates of all of the heat radiation units and all of the at least one intermediate plate are alternately integrated with each other through connecting members at both ends in a direction perpendicular to a flow direction of the cooling fluid in the cooling fluid passage of the casing.

10. The cooling apparatus as recited in claim 1,
wherein the pin fins include upper pin fins projecting from an upper surface of the substrate in the vertical direction and lower pin fins projecting from an lower surface of the substrate in the vertical direction, the lower surface being opposite to the upper surface in the vertical direction,
wherein the lower pin fins and the upper pin fins of the heat radiation units adjacent to each other in the vertical direction are the same in cross-sectional shape and size, and
wherein the lower pin fins and the upper pin fins of the heat radiation units adjacent to each other in the vertical direction overlap at least partially when viewed in the vertical direction.

11. A cooling apparatus comprising:
a casing comprising:
 a top wall;
 a bottom wall opposite to the top wall in a vertical direction; and
 a cooling fluid passage provided between the top wall and the bottom wall in the vertical direction; and
a heat radiator arranged in the cooling fluid passage in the casing, the heat radiator comprising:
 heat radiation units arranged in a stacked manner in the vertical direction and including an uppermost heat radiation unit provided on the top wall and a lowermost heat radiation unit provided on the bottom wall; and
 at least one intermediate plate each of which is arranged between adjacent heat radiation units of the heat radiation units in the vertical direction,
wherein each of the heat radiation units comprises a substrate and pin fins provided on the substrate in a state in which its longitudinal direction is oriented in the vertical direction,
wherein the substrate of each of the heat radiation units and the at least one intermediate plate are spaced apart in the vertical direction,
wherein the pin fins of the uppermost heat radiation unit are in thermal contact with the top wall of the casing,
wherein the pin fins of the lowermost heat radiation unit are in thermal contact with the bottom wall of the casing,
wherein the pin fins of the adjacent heat radiation units are in thermal contact with the at least one intermediate plate,
wherein the heat radiation units consist of the uppermost heat radiation unit and the lowermost heat radiation unit,
wherein the at least one intermediate plate consists of a single intermediate plate provided between the uppermost heat radiation unit and the lowermost heat radiation unit,
wherein an upper surface of the substrate of the uppermost heat radiation unit is metallurgically secured to the top wall of the casing,
wherein the pin fins of the uppermost heat radiation unit project only from a lower surface of the substrate of the uppermost heat radiation unit which is opposite to the upper surface of the uppermost heat radiation unit in the vertical direction,
wherein lower end surfaces of the pin fins of the uppermost heat radiation unit are secured to the single intermediate plate,
wherein a lower surface of the substrate of the lowermost heat radiation unit is secured to the bottom wall of the casing,
wherein the pin fins of the lowermost heat radiation unit project only from an upper surface of the substrate of the lowermost heat radiation unit which is opposite to the lower surface of the lowermost heat radiation unit in the vertical direction, and
wherein upper end surfaces of the pin fins of the lowermost heat radiation unit are metallurgically secured to the single intermediate plate.

12. A cooling apparatus comprising:
a casing comprising:
 a top wall;
 a bottom wall opposite to the top wall in a vertical direction; and
 a cooling fluid passage provided between the top wall and the bottom wall in the vertical direction; and
a heat radiator arranged in the cooling fluid passage in the casing, the heat radiator comprising:
 heat radiation units arranged in a stacked manner in the vertical direction and including an uppermost heat radiation unit provided on the top wall and a lowermost heat radiation unit provided on the bottom wall; and
 at least one intermediate plate each of which is arranged between adjacent heat radiation units of the heat radiation units in the vertical direction,
wherein each of the heat radiation units comprises a substrate and pin fins provided on the substrate in a state in which its longitudinal direction is oriented in the vertical direction, wherein the substrate of each of the heat radiation units and the at least one intermediate plate are spaced apart in the vertical direction, wherein the pin fins of the uppermost heat radiation unit are in thermal contact with the top wall of the casing, wherein the pin fins of the lowermost heat radiation unit are in thermal contact with the bottom wall of the casing, wherein the pin fins of the adjacent heat radiation units are in thermal contact with the at least one intermediate plate, wherein a distance between the substrate and an adjacent intermediate plate closest to the substrate of the at least one intermediate plate in the vertical direction is 1.3 mm or less.

* * * * *